US008022767B2

(12) United States Patent
Sutardja

(10) Patent No.: US 8,022,767 B2
(45) Date of Patent: *Sep. 20, 2011

(54) HIGH-SPEED, MULTI-STAGE CLASS AB AMPLIFIERS

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 12/849,238

(22) Filed: Aug. 3, 2010

(65) Prior Publication Data

US 2010/0295620 A1 Nov. 25, 2010

Related U.S. Application Data

(62) Division of application No. 12/180,930, filed on Jul. 28, 2008, now Pat. No. 7,768,352.

(60) Provisional application No. 61/028,033, filed on Feb. 12, 2008, provisional application No. 61/013,847, filed on Dec. 14, 2007.

(51) Int. Cl.
*H03F 3/04* (2006.01)
(52) U.S. Cl. ............... 330/288; 330/255; 330/259
(58) Field of Classification Search .......... 330/252–261, 330/288
See application file for complete search history.

(56) References Cited

U.S. PATENT DOCUMENTS

| 6,265,941 B1 | 7/2001 | Lopata |
| 7,023,271 B1 | 4/2006 | Aram |
| 7,586,373 B2 * | 9/2009 | Kim ........................... 330/257 |
| 2007/0285167 A1 | 12/2007 | Ebner |

OTHER PUBLICATIONS

A Fully Differential CMOS Line Driver for ISDN; Luciano Tomasini, Alberto Gola, and Rinaldo Castello, Member, IEEE; IEEE Journal of Solid-State Circuits, vol. 25, No. 2, Apr. 1990; pp. 546-554.
Common-Mode Feedback Techniques: A Tutorial; Texas A&M University; Edgar Sanchez-Sinencio; Feb. 22, 2005; 46 pages.
Notification of Transmittal of the International Search Report and The Written Opinion of The International Searching Authority, or the Declaration dated Dec. 19, 2008 in reference to PCT/US2008/081442.
Castello, R. et al; "A High-Performance Micropower Switched-Capacitor Filter"; IEEE Journal of Solid-State Circuits, IEEE Service Center, Piscataway, NJ, US, vol. SC-20, No. 6, Dec. 1, 1985, pp. 1122-1132, XP002026671 ISSN: 0018-9200.
Pernici, S. et al., "A CMOS Low-Distortion Fully Differential Power Amplifier with Double Nested Miller Compensation," IEEE Journal of Solid-State Circuits, IEEE Service Center, Piscataway, NJ, US, vol. 28, No. 7, Jul. 1, 1993, pp. 758-763, XP000322305 ISSN: 0018-9200.

(Continued)

*Primary Examiner* — Hieu P Nguyen

(57) ABSTRACT

A multi-stage Class AB amplifier system includes a first Class AB amplifier circuit configured to receive an input signal. A bias circuit is configured to receive an output of the first Class AB amplifier circuit. A second Class AB amplifier circuit is in communication with the bias circuit. The second Class AB amplifier circuit is configured to generate an output signal. A current mirror circuit is arranged between the first Class AB amplifier circuit and the bias circuit. A common-mode feedback circuit is configured to generate a feedback signal based on the output signal.

15 Claims, 6 Drawing Sheets

OTHER PUBLICATIONS

Ziazadeh, R. M. et al., "A Multistage Amplifier Topology with Embedded Tracking Compensation," Custom Integrated Circuits Conference, 1998. Proceedings of the IEEE 1998 Santa Clara, CA, USA May 11-14, 1998, New York, NY, USA, IEEE, US, May 11, 1998, pp. 361-364, XP010293907 ISBN: 978-0-7803-4292-7.

Gray, Paul R., and Robert G. Meyer. Analysis and Design of Analog Integrated Circuits. 3rd ed. John Wiley & Sons, 1993. p. 651.
Hearn, W. E. "A fast slewing monolithic operational amplifier." Solid-State Circuits Conference. Digest of Technical Papers. 1970 IEEE International Solid-State Circuits Conference; Session XIII: Linear Circuit Techniques (1970): p. 156-157.

* cited by examiner

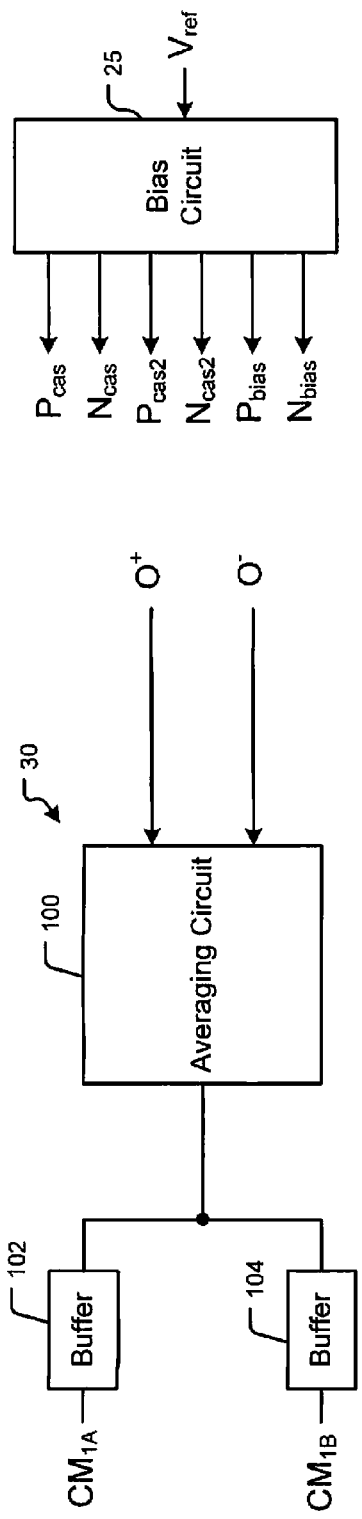
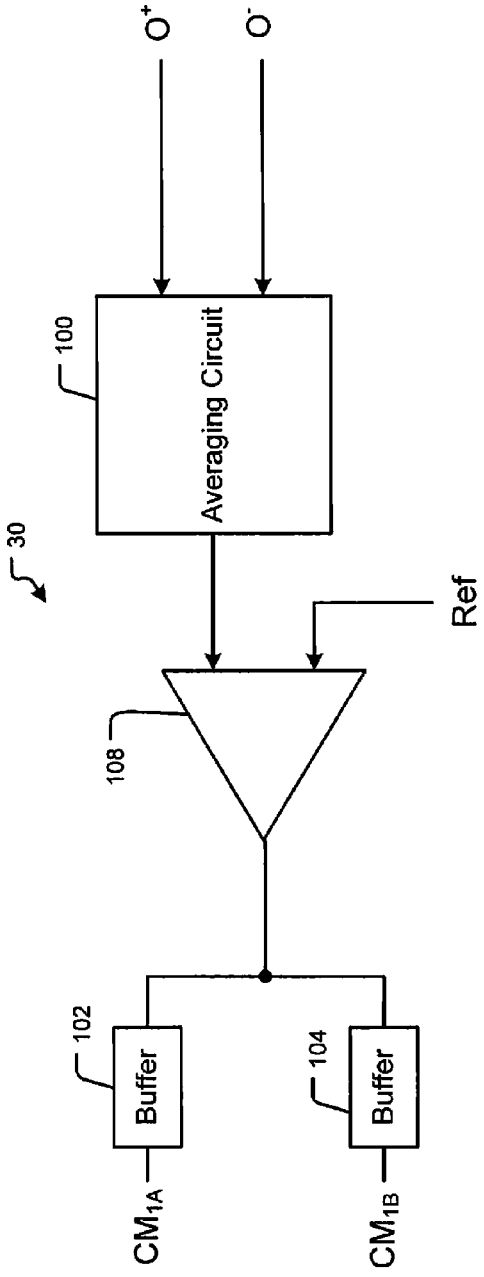
FIG. 5A
FIG. 5B
FIG. 6

HIGH-SPEED, MULTI-STAGE CLASS AB AMPLIFIERS

CROSS-REFERENCE TO RELATED APPLICATIONS

This application is a divisional of U.S. patent application Ser. No. 12/180,930, filed Jul. 28, 2008, now U.S. Pat. No. 7,768,352, issued Aug. 3, 2010, which claims the benefit of U.S. Provisional Application No. 61/028,033, filed Feb. 12, 2008 and U.S. Provisional Application No. 61/013,847, filed Dec. 14, 2007. The disclosures of the above applications are incorporated herein by reference in their entirety.

FIELD

The present disclosure relates to amplifiers, and more particularly to high-speed class AB amplifiers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Class A amplifying devices operate over an entire cycle of an input signal. An output signal of these devices is a scaled-up replica of the input signal. These devices are not very efficient since they have a maximum efficiency of 50% with inductive output coupling and 25% with capacitive output coupling.

In Class A amplifying devices, an amplifying element such as a transistor is biased such that the device is always conducting. The amplifying element is operated over a linear portion of the transfer characteristic of the transistor. Because the amplifying element is always conducting, power is drawn from the power supply even when there is no input. If high output power is needed, power consumption (and the accompanying heat) may become significant.

Class B amplifying devices amplify during half of an input cycle. As a result, Class B amplifying devices tend to increase distortion but have higher efficiency than Class A amplifying devices. Class B amplifying devices have a maximum efficiency over 75%. This is because the amplifying element is switched off half of the time and does not dissipate power at this time.

Class B amplifying devices may use complementary transistor pairs (a "push-pull" transistor arrangement). Complementary devices amplify opposite halves of the input signal. Mismatch or crossover distortion may occur when re-joining the halves of the signal. One solution to the mismatch problem involves biasing the transistors to be just on, rather than completely off when not in use. This biasing approach is called Class AB operation. In other words, Class AB amplifying devices may include a class B output stage that is biased so that both transistors are conducting around the crossover point.

SUMMARY

A multi-stage Class AB amplifier system comprises a first Class AB amplifier circuit that receives an input signal. A bias circuit receives an output of the first Class AB amplifier circuit. A second Class AB amplifier circuit communicates with the bias circuit and generates an output signal. A common-mode feedback circuit generates a feedback signal based on the output signal.

In other features, a current mirror circuit is arranged between the first Class AB amplifier circuit and the bias circuit. The common-mode feedback signal is fed back to at least one of the first Class AB amplifier circuit, the bias circuit and the current mirror circuit. The input signal comprises a differential input signal. The first Class AB amplifier circuit includes first and second level shifters that receive the differential input signal. The first Class AB amplifier circuit includes cross-coupled transistor pairs.

In other features, a frequency compensation circuit is arranged between the bias circuit and the second Class AB amplifier circuit. The frequency compensation circuit comprises a Miller compensation circuit. An amplifier circuit is arranged between the first Class AB amplifier circuit and the bias circuit. The amplifier circuit comprises a cascode amplifier. The multi-stage Class AB amplifier circuit operates in a differential mode.

A multi-stage Class AB amplifier system comprises a first Class AB amplifier circuit that receives a differential input signal. First and second bias circuits receive first and second differential outputs of the first Class AB amplifier circuit and generate bias signals. A second Class AB amplifier circuit receives the bias signals and that generates a differential output signal. A common-mode feedback circuit generates feedback signals based on the differential output signal.

In other features, M current mirror circuits are arranged between the first Class AB amplifier circuit and the first and second bias circuits, where M is an integer greater than three. The common-mode feedback signals are fed back to at least one of the first Class AB amplifier circuit, the first and second bias circuits and the M current mirror circuits. The first Class AB amplifier circuit includes first and second level shifters that receive the differential input signal. The first Class AB amplifier circuit includes cross-coupled transistor pairs. M frequency compensation circuits are arranged between the first and second bias circuits and the second Class AB amplifier, wherein M is an integer greater than three. The M frequency compensation circuits each comprises a Miller compensation circuit.

In other features, M amplifier circuits are arranged between the first Class AB amplifier circuit and the first and second bias circuits, wherein M is an integer greater than three. The M amplifier circuits each comprise a cascode amplifier.

A method for operating a multi-stage Class AB amplifier system comprises providing a first Class AB amplifier circuit that receives an input signal; receiving an output of the first Class AB amplifier circuit using a bias circuit; providing a second Class AB amplifier circuit that communicates with the bias circuit and that generates an output signal; and generating a common-mode feedback signal based on the output signal.

In other features, the method includes providing a current mirror circuit arranged between the first Class AB amplifier circuit and the bias circuit. The common-mode feedback signal is fed back to at least one of the first Class AB amplifier circuit, the bias circuit and the current mirror circuit. The input signal comprises a differential input signal. The first Class AB amplifier circuit includes first and second level shifters that receive the differential input signal. The first Class AB amplifier circuit includes cross-coupled transistor pairs.

In other features, the method includes performing frequency compensation between the bias circuit and the second Class AB amplifier circuit. The frequency compensation comprises Miller compensation. The method includes providing an amplifier circuit arranged between the first Class AB amplifier circuit and the bias circuit. The amplifier circuit comprises a cascode amplifier. The multi-stage Class AB amplifier circuit operates in a differential mode.

A method of operating a multi-stage Class AB amplifier system comprises providing a first Class AB amplifier circuit that receives a differential input signal; receiving first and second differential outputs of the first Class AB amplifier circuit and generating differential bias signals using first and second bias circuits; providing a second Class AB amplifier circuit that receives the differential bias signals and that generates a differential output signal; and generating common-mode feedback signals based on the differential output signal.

In other features, the method includes arranging M current mirror circuits between the first Class AB amplifier circuit and the first and second bias circuits, where M is an integer greater than three. The method includes feeding back the common-mode feedback signals to at least one of the first Class AB amplifier circuit, the first and second bias circuits and the M current mirror circuits.

In other features, the first Class AB amplifier circuit includes first and second level shifters that receive the differential input signal. The first Class AB amplifier circuit includes cross-coupled transistor pairs. The method includes providing frequency compensation between the first and second bias circuits and the second Class AB amplifier. The frequency compensation comprises Miller compensation.

In other features, the method includes arranging M amplifier circuits between the first Class AB amplifier circuit and the bias circuit, wherein M is an integer greater than three. The M amplifier circuits each comprise a cascode amplifier.

A multi-stage Class AB amplifier system comprises first Class AB amplifier means for amplifying that receives an input signal. Bias means for biasing receives an output of the first Class AB amplifier means. Second Class AB amplifier means for amplifying communicates with the bias means and generates an output signal. Common-mode feedback means generates a feedback signal based on the output signal.

In other features, current mirror means provides current and is arranged between the first Class AB amplifier means and the bias means. The common-mode feedback signal is fed back to at least one of the first Class AB amplifier means, the bias means and the current mirror means. The input signal comprises a differential input signal. The first Class AB amplifier means includes first and second level shifting means for shifting that receive the differential input signal. The first Class AB amplifier means includes cross-coupled transistor pairs.

In other features, frequency compensation means compensates frequency and is arranged between the bias means and the second Class AB amplifier means. The frequency compensation means performs Miller compensation. Amplifier means for amplifying is arranged between the first Class AB amplifier means and the bias means. The amplifier means comprises a cascode amplifier. The multi-stage Class AB amplifier means operates in a differential mode.

A multi-stage Class AB amplifier system comprises first Class AB amplifier means for amplifying that receives a differential input signal. First and second bias means for biasing receive first and second differential outputs of the first Class AB amplifier means and generate differential bias signals. Second Class AB amplifier means for amplifying receives the differential bias signals and generates a differential output signal. Common-mode feedback means generates feedback signals based on the differential output signal.

In other features, M current mirror means for providing current are arranged between the first Class AB amplifier means and the first and second bias means, where M is an integer greater than three. The common-mode feedback signals are fed back to at least one of the first Class AB amplifier means, the first and second bias means and the M current mirror means. The first Class AB amplifier means includes first and second level shifting means that receive the differential input signal. The first Class AB amplifier means includes cross-coupled transistor pairs. M frequency compensation means are arranged between the first and second bias means and the second Class AB amplifier means, wherein M is an integer greater than three. The M frequency compensation means perform Miller compensation. M amplifier means for amplifying are arranged between the first Class AB amplifier means and the first and second bias means, wherein M is an integer greater than three. The M amplifier means each comprise a cascode amplifier.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 5A and 5B are exemplary common mode feedback circuits for generating common mode feedback signals;

FIG. 6 illustrates a bias generating circuit;

DETAILED DESCRIPTION

Figure 1:
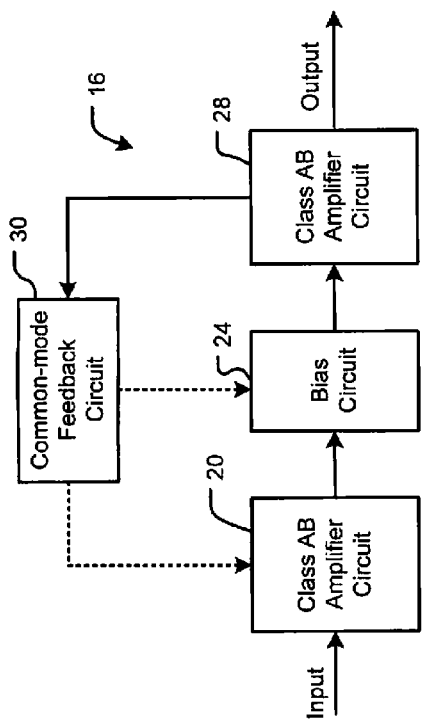
FIG. 1 is a functional block diagram of an exemplary multi-stage Class AB amplifier according to the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Referring now to FIG. 1, an exemplary multi-stage Class AB amplifier 16 according to the present disclosure is illustrated. The multi-stage class AB amplifier 16 may include by a first Class AB amplifier circuit 20 that receives an input signal. An output of the first Class AB amplifier circuit 20 communicates with a bias circuit 24, which generates bias signals for a second Class AB amplifier circuit 28. A common mode feedback circuit 30 may generate common mode feedback signals that may be input to the first Class AB amplifier circuit 20 or to another component of the multi-stage class AB amplifier 16, as will be described further below.

Figure 2:
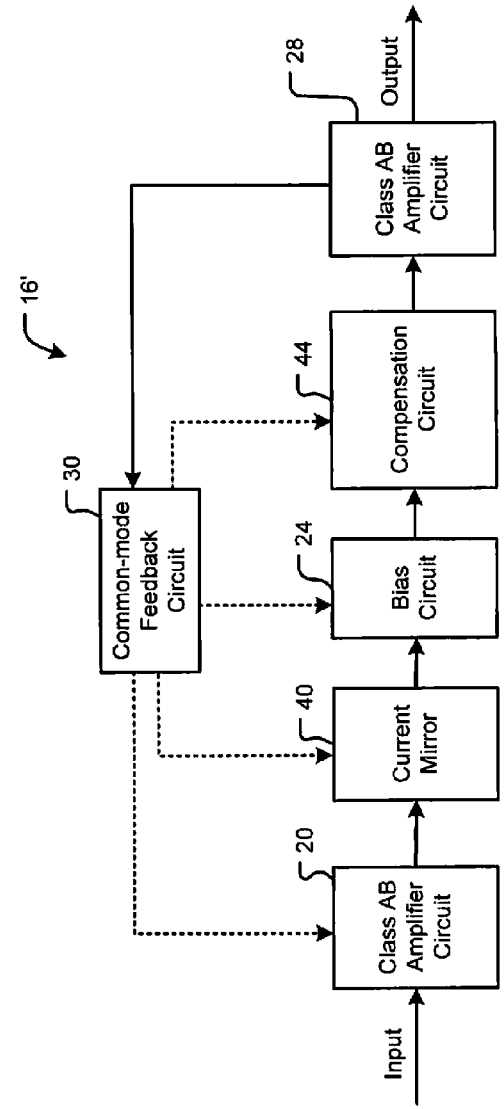
FIG. 2 is a functional block diagram of another exemplary multi-stage Class AB amplifier according to the present disclosure.

Referring now to FIG. 2, another exemplary multi-stage Class AB amplifier 16' according to the present disclosure is shown. Reference numbers from FIG. 1 are used where appropriate. The multi-stage Class AB amplifier 16' may further comprise a current mirror 40 that communicates with the first Class AB amplifier circuit 20 and the bias circuit 24. The multi-stage Class AB amplifier 16 may also further include a frequency compensation circuit 44 that communicates with the bias circuit 24 and the second Class AB amplifier circuit 28. The frequency compensation circuit 44 may adjust a frequency of poles of the second Class AB amplifier 28. Suitable compensation circuits include Miller compensation, Ahuja compensation, as well as compensation described in a commonly assigned U.S. Pat. No. 7,023,071 to Aram and entitled "Variable-Gain Constant-Bandwidth Transimpedance Amplifier", which is hereby incorporated by reference in its entirety.

Figure 3:
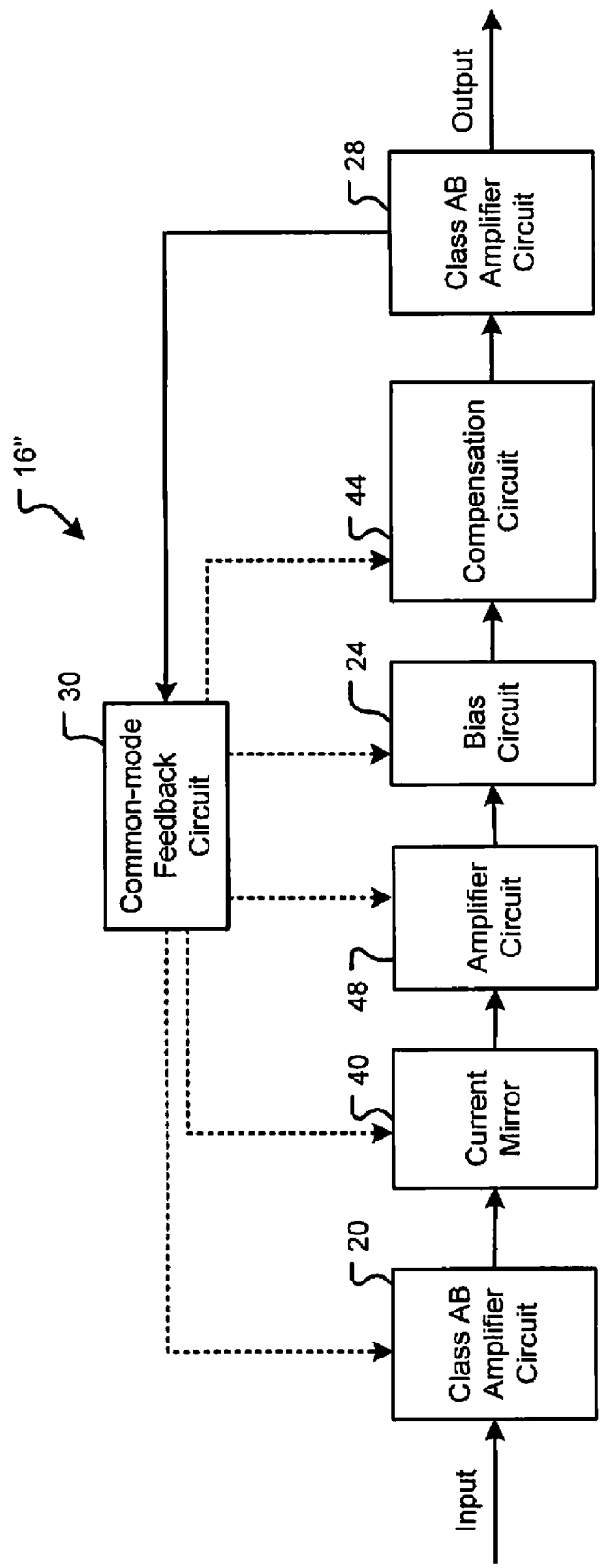
FIG. 3 is a functional block diagram of another exemplary multi-stage Class AB amplifier according to the present disclosure.

Referring now to FIG. 3, another exemplary multi-stage Class AB amplifier 16" according to the present disclosure is shown. Reference numbers from FIGS. 1 and 2 are used where appropriate. The multi-stage Class AB amplifier 16" may further include amplifier circuit 48 that amplifies bias signals from the current mirror circuit 40.

Figure 4:
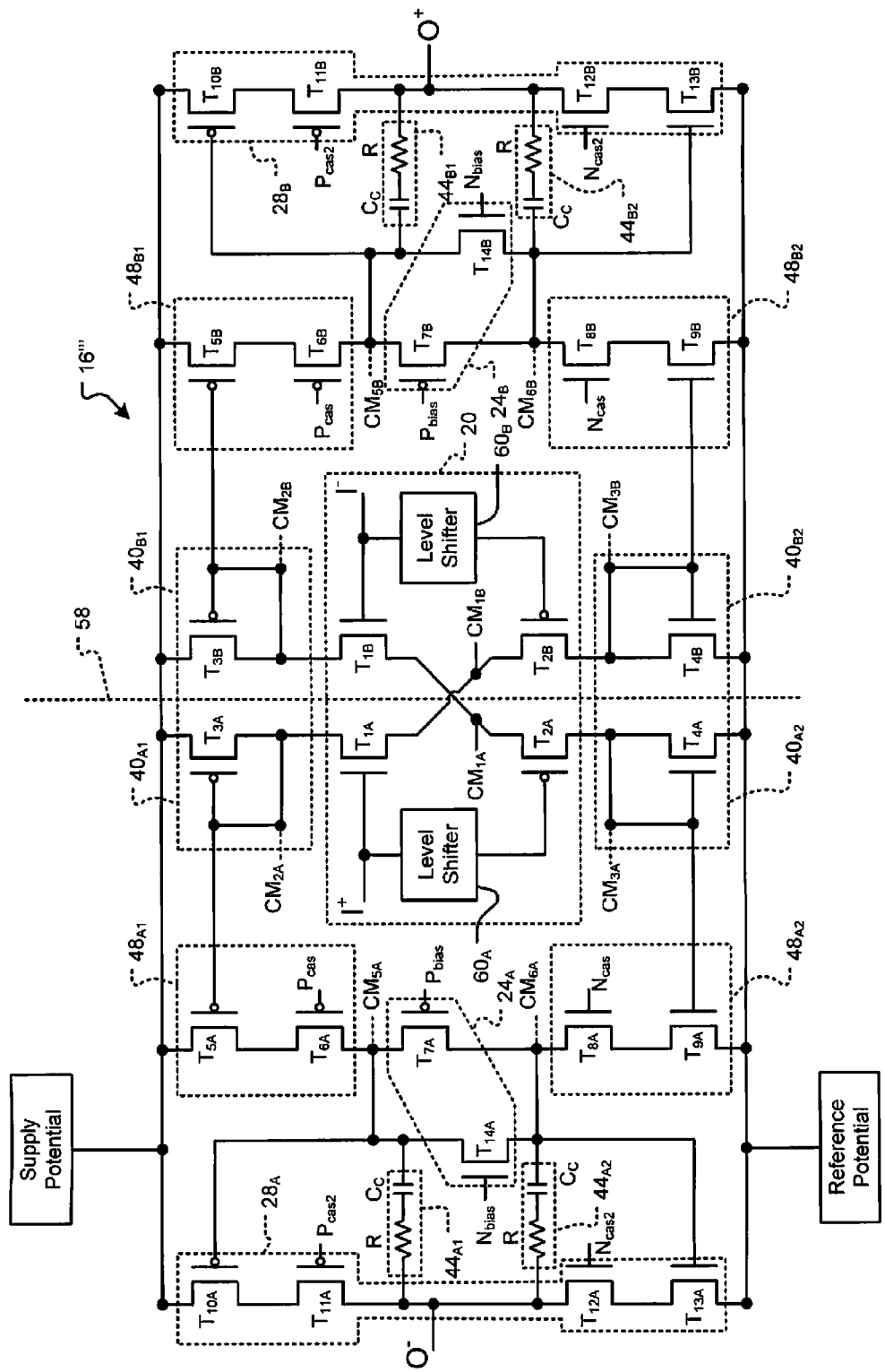
FIG. 4 is an electrical schematic of another exemplary multi-stage Class AB amplifier according to the present disclosure.

Referring now to FIG. 4, another exemplary multi-stage Class AB amplifier 16''' according to the present disclosure is shown. The multi-stage class AB amplifier 16" in FIG. 4 has a symmetric configuration about a dotted line 58. Elements on the left in FIG. 4 are designated A and mirrored components on the right in FIG. 4 are designated B. Therefore, not all of the components will be explicitly discussed below to the extent that they have a mirror arrangement of other components that are expressly discussed below.

The first Class AB amplifier circuit 20 may include level shifters 60A and 60B (collectively level shifters 60) and transistors $T_{1A}$ and $T_{1B}$ having control terminals that receive input signals $I^+$ and $I^-$. The level shifters shift a level of the input signals. Outputs of the level shifters 60 are input to control terminals of transistors $T_{2A}$ and $T_{2B}$. The transistors $T_{1A}$ and $T_{1B}$ are cross-coupled to transistors $T_{2A}$ and $T_{2B}$. In other words, first terminals of transistors $T_{2A}$ and $T_{2B}$ communicate with second terminals of transistors $T_{1A}$ and $T_{1B}$.

First terminals of transistors $T_{1A}$ and $T_{1B}$ communicate with current mirrors identified at $40_{A1}$ and $40_{B1}$. More particularly, first and second current mirrors $40_{A1}$ and $40_{B1}$ include transistors $T_{3A}$ and $T_{3B}$, respectively. Control terminals of the transistors $T_{3A}$ and $T_{3B}$ communicate with second terminals of transistors $T_{3A}$ and $T_{3B}$ and first terminals of transistors $T_{1A}$ and $T_{1B}$, respectively.

Second terminals of transistors $T_{2A}$ and $T_{2B}$ communicate with current mirrors identified at $40_{A2}$ and $40_{B2}$. More particularly, third and fourth current mirrors $40_{A2}$ and $40_{B2}$ include transistors $T_{4A}$ and $T_{4B}$, respectively. Control terminals of the transistors $T_{4A}$ and $T_{4B}$ communicate with first terminals of transistors $T_{3A}$ and $T_{3B}$ and second terminals of transistors $T_{2A}$ and $T_{2B}$, respectively.

An output of the current mirror $40_{A2}$ including transistor $T_{4A}$ is input to an amplifier circuit $48_{A2}$. The amplifier circuit $48_{A2}$ may include cascode amplifier. The cascode amplifier may include first and second transistors $T_{8A}$ and $T_{9A}$. More particularly, the control terminal of transistor $T_{4A}$ communicates with a gate of transistor $T_{9A}$. A first terminal of transistor $T_{9A}$ communicates with a second terminal of transistor $T_{8A}$. A control terminal of transistor $T_{8A}$ receives a cascode bias signal $N_{cas}$.

An output of the current mirror $40_{A1}$ including transistor $T_{3A}$ is input to an amplifier circuit $48_{A1}$. The amplifier circuit $48_{A1}$ may include cascode amplifier. The cascode amplifier may include first and second transistors $T_{5A}$ and $T_{6A}$. More particularly, the control terminal of transistor $T_{3A}$ communicates with a control terminal of transistor $T_{5A}$. A second terminal of transistor $T_{5A}$ communicates with a first terminal of transistor $T_{6A}$. A control terminal of transistor $T_{6A}$ receives a cascode bias signal $P_{cas}$. Similar amplifier circuits $48_{B1}$ and $48_{B2}$ are provided as well.

A transistor $T_{7A}$ communicates with the second terminal of transistor $T_{6A}$ and with a first terminal of transistor $T_{8A}$. A control terminal of transistor $T_{7A}$ receives a bias signal $P_{bias}$.

The second Class AB amplifier $28_A$ includes transistors $T_{10A}$, $T_{11A}$, $T_{12A}$ and $T_{13A}$. A second terminal of transistor $T_{10A}$ communicates with a first terminal of transistor $T_{11A}$. A control terminal of transistor $T_{11A}$ receives a bias signal $P_{cas2}$. Likewise, a second terminal of transistor $T_{12A}$ communicates with a first terminal of transistor $T_{13A}$. A second terminal of transistor $T_{11A}$ communicates with a first terminal of transistor $T_{12A}$. An output of the multi-stage amplifier $O^-$ is taken between the transistors $T_{11A}$ and $T_{12A}$.

A first terminal of transistor $T_{14A}$ may be connected to a control terminal of transistor $T_{10A}$, to a compensation circuit $44_{A1}$, to a second terminal of transistor $T_{6A}$ and a first terminal of transistor $T_{7A}$. A second terminal of transistor $T_{14A}$ may be connected to a control terminal of transistor $T_{13A}$, to a compensation circuit $44_{A2}$, to a second terminal of transistor $T_{7A}$ and a first terminal of transistor $T_{8A}$. A control terminal of transistor T14A receives a bias signal $N_{bias}$.

The bias circuit 24 may comprise the transistors $T14_A$, $T7_A$, $T14_B$, $T7_B$ and bias generation circuit 25 (in FIG. 6) that generates the bias signals $N_{bias}$ and $P_{bias}$.

The compensation circuit 44 may include multiple compensation circuits $44_{A1}$, $44_{A2}$, $44_{B1}$ and $44_{B2}$. For example, the compensation circuit $44_{A1}$ may comprise Miller compensation and may include capacitance $C_c$ and resistance R that are arranged between the first terminal of the transistor $T_{7A}$ and the output $O^-$. Other types of compensation are contemplated.

Common-mode feedback can be provided by the common mode feedback circuit 30 at various locations in the multi-stage Class AB amplifier of FIG. 4. For example, common-mode feedback $CM_{1A}$ and $CM_{1B}$ can be provided at the second and first terminals of the transistors $T_{1B}/T_{2A}$ and $T_{1A}/T_{2B}$. Other locations for common-mode feedback $CM_{2A}$ and $CM_{2B}$ include the control terminals of transistors $T_{3A}$ and $T_{3B}$. Still other locations for common-mode feedback $CM_{3A}$ and $CM_{3B}$ include the control terminals of transistors $T_{4A}$ and $T_{4B}$.

The multi-stage class AB amplifiers according to the present disclosure have relatively low quiescent current.

Referring now to FIGS. 5A and 5B, exemplary circuits for generating common mode feedback signals are shown. In FIG. 5A, the outputs O⁺ and O⁻ are input to an averaging circuit 100. The averaging circuit 100 generates an output based on $$\frac{O^+ + O^-}{2}.$$

The output of the averaging circuit 100 may be input to optional buffers 102 and 104, which output $CM_{1A}$ and $CM_{1B}$.

In FIG. 6B, the outputs O⁺ and O⁻ may be input to the averaging circuit 100. The averaging circuit 100 generates an output based on $$\frac{O^+ + O^-}{2}.$$

The output of the averaging circuit 100 may be input to a comparing circuit 108. The comparing circuit 108 compares the output of the averaging circuit 100 to a voltage reference. An output of the comparing circuit 108 may be input to optional buffers 102 and 104, which output a common mode signal to one or more of the common mode inputs. For example, the common mode signal may be output to the common mode input location $CM_{1A}$ and $CM_{1B}$ from FIG. 4. However, the common mode signal may be input to other common mode input locations from FIG. 4 such as $CM_{2A}$ and $CM_{2B}$, $CM_{3A}$ and $CM_{3B}$, $CM_{4A}$ and $CM_{4B}$, $CM_{5A}$ and $CM_{5B}$ and/or $CM_{6A}$ and $CM_{6B}$.

Referring now to FIG. 6, a bias signal generating circuit 25 for the bias circuit 24 and cascode amplifiers is shown. The bias signal generating circuit 25 receives a reference voltage and generates bias signals for components of the multi-stage class AB amplifier (including bias circuit 24) of FIG. 4.

Transistors $T_{1A}$ and $T_{1B}$, $T_{4A}$ and $T_{4B}$, $T_{8A}$ and $T_{8B}$, $T_{9A}$ and $T_{9B}$, $T_{12A}$ and $T_{12B}$, and $T_{13A}$ and $T_{13B}$ may be NMOS (or PMOS) transistors, although other transistor types may be used. Transistors $T_{2A}$ and $T_{2B}$, $T_{3A}$ and $T_{3B}$, $T_{5A}$ and $T_{5B}$, $T_{6A}$ and $T_{6B}$, $T_{10A}$ and $T_{10B}$ and $T_{11A}$ and $T_{11B}$ may be PMOS (or NMOS) transistors, although other transistor types may be used.

Figure 7B:
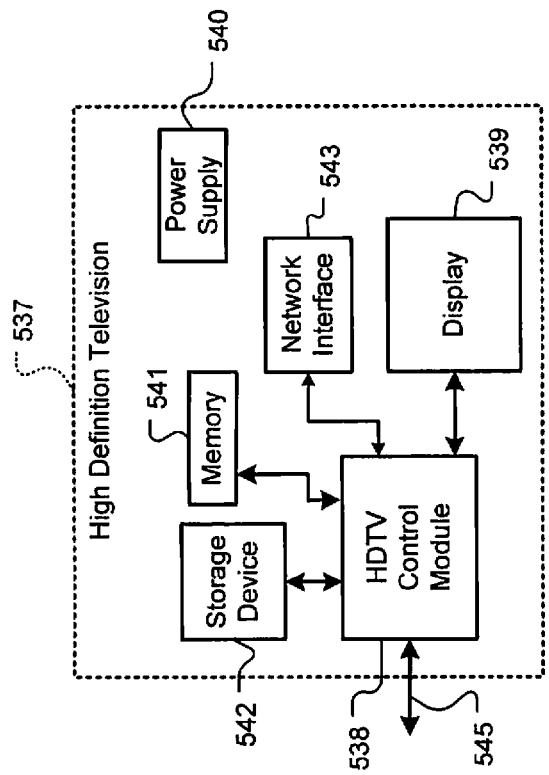
FIG. 7B is a functional block diagram of a high definition television including a network interface with multi-stage Class AB amplifier according to the present disclosure.
Figure 7A:
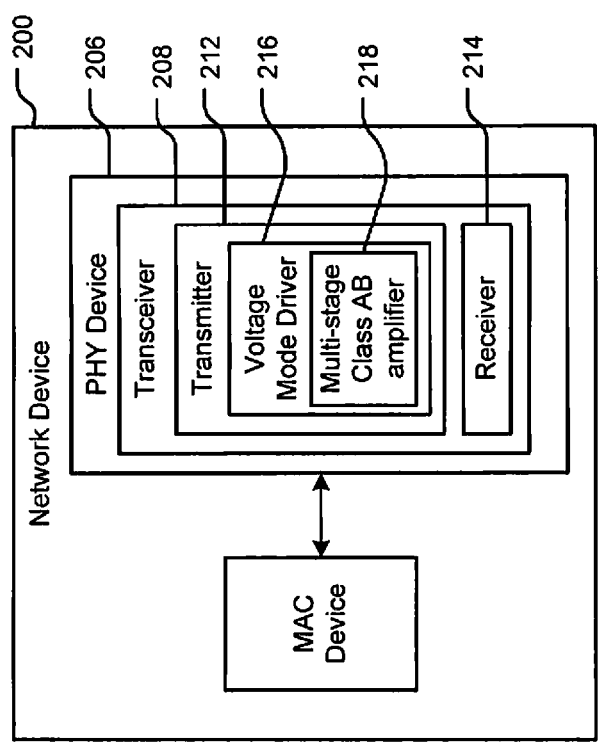
FIG. 7A is a functional block diagram of a network device that includes a voltage mode driver including a multi-stage Class AB amplifier according to the present disclosure.

Referring now to FIG. 7A, the teachings of the disclosure can be implemented in a voltage mode driver of a network device 200. For example, the network device 200 may comprise a medium access controller (MAC) device 202 and a physical layer (PHY) device 206. The PHY device 206 may comprise a transmitter 212 and a receiver 214. The transmitter 212 may include a voltage mode driver 216 that includes a multi-stage class AB amplifier 218 described herein. The network device 200 may be operated at speeds greater than or equal to 1 Gigabit per second. The network device 200 may be Ethernet compliant. The network device 200 may comprise a router, switch, network interface, client station, access point, or any other network device.

Referring now to FIG. 7B, the teachings of the disclosure can be implemented in a voltage mode driver of a network interface of a high definition television (HDTV) 537. The HDTV 537 includes an HDTV control module 538, a display 539, a power supply 540, memory 541, a storage device 542, a network interface 543, and an external interface 545. If the network interface 543 includes a wireless local area network interface, an antenna (not shown) may be included.

The HDTV 537 can receive input signals from the network interface 543 and/or the external interface 545, which can send and receive data via cable, broadband Internet, and/or satellite. The HDTV control module 538 may process the input signals, including encoding, decoding, filtering, and/or formatting, and generate output signals. The output signals may be communicated to one or more of the display 539, memory 541, the storage device 542, the network interface 543, and the external interface 545.

Memory 541 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 542 may include an optical storage drive, such as a DVD drive, and/or a hard disk drive (HDD). The HDTV control module 538 communicates externally via the network interface 543 and/or the external interface 545. The power supply 540 provides power to the components of the HDTV 537.

Figure 7C:
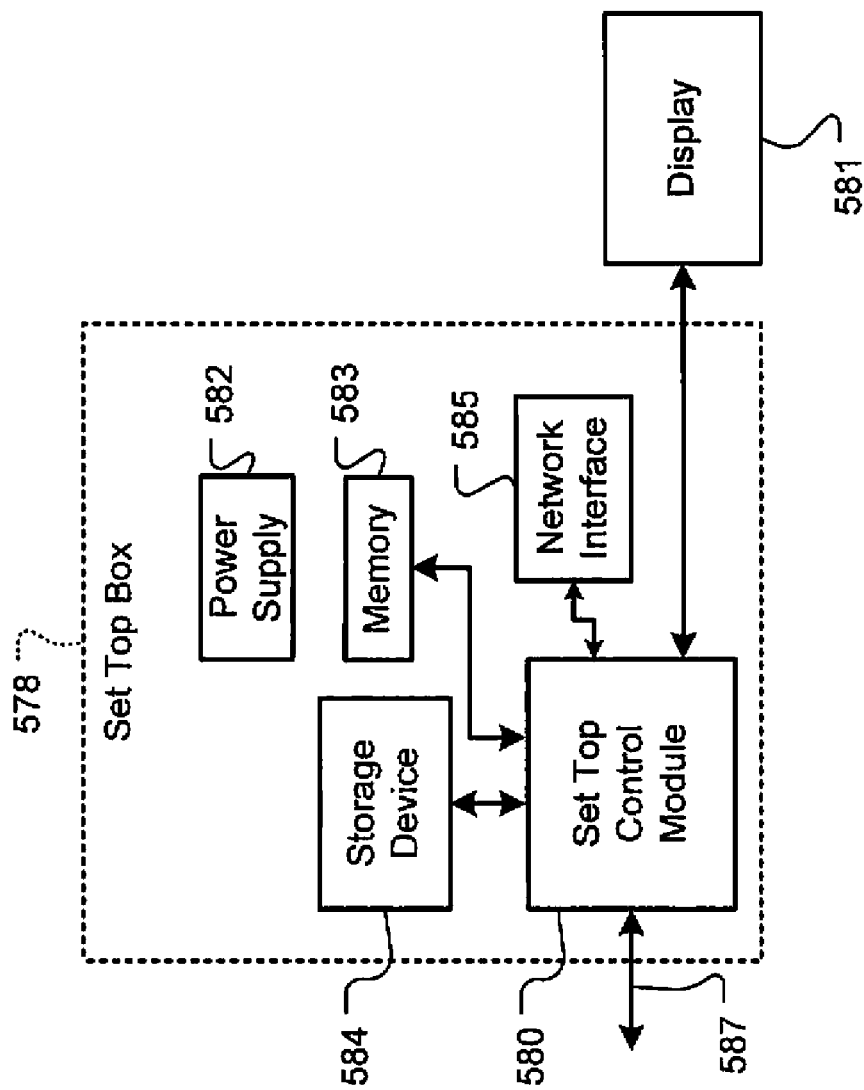
FIG. 7C is a functional block diagram of a set top box including network interface with a multi-stage Class AB amplifier according to the present disclosure.

Referring now to FIG. 7C, the teachings of the disclosure can be implemented in a voltage mode driver of a network interface of a set top box 578. The set top box 578 includes a set top control module 580, a display 581, a power supply 582, memory 583, a storage device 584, and a network interface 585. If the network interface 585 includes a wireless local area network interface, an antenna (not shown) may be included.

The set top control module 580 may receive input signals from the network interface 585 and an external interface 587, which can send and receive data via cable, broadband Internet, and/or satellite. The set top control module 580 may process signals, including encoding, decoding, filtering, and/or formatting, and generate output signals. The output signals may include audio and/or video signals in standard and/or high definition formats. The output signals may be communicated to the network interface 585 and/or to the display 581. The display 581 may include a television, a projector, and/or a monitor.

The power supply 582 provides power to the components of the set top box 578. Memory 583 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 584 may include an optical storage drive, such as a DVD drive, and/or a hard disk drive (HDD).

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A multi-stage Class AB amplifier system, comprising:
    a first Class AB amplifier circuit configured to receive an input signal;
    a bias circuit configured to receive an output of the first Class AB amplifier circuit;
    a second Class AB amplifier circuit in communication with the bias circuit, the second Class AB amplifier circuit configured to generate an output signal;
    a current mirror circuit arranged between the first Class AB amplifier circuit and the bias circuit; and a common-mode feedback circuit configured to generate a feedback signal based on the output signal,
wherein
the input signal comprises a differential input signal; and
the first Class AB amplifier circuit includes a first level shifter and a second level shifter configured to receive the differential input signal.

2. The multi-stage Class AB amplifier system of claim 1, wherein the feedback signal is configured to be fed back to one or more of: the first Class AB amplifier circuit, the bias circuit, or the current mirror circuit.

3. The multi-stage Class AB amplifier system of claim 1, wherein the first Class AB amplifier circuit includes cross-coupled transistor pairs.

4. The multi-stage Class AB amplifier system of claim 1, further comprising a frequency compensation circuit arranged between (i) an output of the second Class AB amplifier circuit and (ii) an input of the second Class AB amplifier circuit.

5. The multi-stage Class AB amplifier system of claim 4, wherein the frequency compensation circuit comprises a Miller compensation circuit.

6. The multi-stage Class AB amplifier system of claim 1, further comprising an amplifier circuit arranged between (i) the first Class AB amplifier circuit and (ii) the bias circuit.

7. The multi-stage Class AB amplifier system of claim 6, wherein the amplifier circuit comprises a cascode amplifier.

8. The multi-stage Class AB amplifier system of claim 1, wherein the multi-stage Class AB amplifier system is configured to operate in a differential mode.

9. A multi-stage Class AB amplifier system, comprising:
a first Class AB amplifier circuit configured to receive a differential input signal;
a first bias circuit configured to (i) receive a first differential output of the first Class AB amplifier circuit and (ii) generate first differential bias signals;
a second bias circuit configured to (i) receive a second differential output of the first Class AB amplifier circuit and (ii) generate second differential bias signals;
M current mirror circuits arranged between the first Class AB amplifier circuit and the first and second bias circuits, wherein M is an integer greater than one;
a second Class AB amplifier circuit configured to
receive the first differential bias signals and the second differential bias signals, and
generate a differential output signal;
M amplifier circuits arranged between (i) the first Class AB amplifier circuit and (ii) the first bias circuit and the second bias circuit; and
a common-mode feedback circuit configured to generate feedback signals based on the differential output signal,
wherein the first Class AB amplifier circuit includes a first level shifter and a second level shifter configured to receive the differential input signal.

10. The multi-stage Class AB amplifier system of claim 9, wherein M is greater than three.

11. The multi-stage Class AB amplifier system of claim 9, wherein the feedback signals are configured to be fed back to one or more of: the first Class AB amplifier circuit, the first bias circuit, the second bias circuit, or the M current mirror circuits.

12. The multi-stage Class AB amplifier system of claim 9, wherein the first Class AB amplifier circuit includes cross-coupled transistor pairs.

13. The multi-stage Class AB amplifier system of claim 9, further comprising M frequency compensation circuits arranged between (i) inputs of the second Class AB amplifier circuit and (ii) outputs of the second Class AB amplifier circuit, wherein M is greater than three.

14. The multi-stage Class AB amplifier system of claim 13, wherein each of the M frequency compensation circuits includes a Miller compensation circuit.

15. The multi-stage Class AB amplifier system of claim 9, wherein each of the M amplifier circuits includes a cascode amplifier.

\* \* \* \* \*